United States Patent [19]

Thomas et al.

[11] Patent Number: 4,539,531
[45] Date of Patent: Sep. 3, 1985

[54] PHASE LOCKED LOOP VARIABLE OSCILLATOR WITH SWITCHED CAPACITORS

[75] Inventors: Terence N. Thomas; John G. Hogeboom, both of Nepean, Canada

[73] Assignee: Northern Telecom Limited, Montreal, Canada

[21] Appl. No.: 535,725

[22] Filed: Sep. 26, 1983

[51] Int. Cl.³ ............................................. H03L 7/00
[52] U.S. Cl. .................................. 331/11; 331/1 A; 331/179
[58] Field of Search ................ 331/1 A, 10, 11, 12, 331/14, 17, 25, 179

[56] References Cited

U.S. PATENT DOCUMENTS 4,179,671 12/1979 Yoshida et al. ............... 331/179 X
4,330,759 5/1982 Anderson ..................... 331/25 X Primary Examiner—Eugene R. LaRoche
Assistant Examiner—Robert J. Pascal
Attorney, Agent, or Firm—J. E. Moorhouse

[57] ABSTRACT

A variable oscillator, suitable for integration as part of a phase lock loop (PLL) clock source in a complementary metal oxide semiconductor (CMOS) integrated circuit, includes an amplifier and terminals for connection to a tank circuit, for example a crystal resonator. Capacitors are alternately coupled and decoupled in relation to the amplifier to cause oscillatory operation at lower and higher frequencies. In the CMOS circuit the reactance is conveniently provided by conductive layers of predetermined dimensions being carried by an oxide layer. Each layer provides a capacitive reactance which is arranged in series with a field effect device being controlled by associated PLL control circuitry. The control circuit includes a strobe generator for strobing a phase detector in response to a data signal received by an associated receiver. Each time the phase detector is strobed it registers one of an early or late phase indication. The phase indication is used to control the field effect devices. The phase indication is applied via a register at an instance of consistent phase angle of the oscillatory signal from the output of the amplifier whereby glitch free operation is achieved. In one example, the variable oscillator is controlled by fast and slow control signals to improve convergence toward the desired frequency of operation.

12 Claims, 4 Drawing Figures

PHASE LOCKED LOOP VARIABLE OSCILLATOR WITH SWITCHED CAPACITORS

The invention relates to oscillators and more particularly to oscillators which are variable in response to control apparatus such that preferred frequencies of electrical signal oscillations are obtained.

The invention is particularly useful in digital signal receiver circuits wherein data bit states of an information bit stream are determined by periodic sampling of the bit stream. The rate at which the bit stream is sampled is usually determined by one of two basic types of clock sources. In a case where signal excursions in the bit stream normally occur with frequent degrees of regularity, a suitable clock souce may consist of a high Q resonant circuit followed by a squaring amplifier. In a case where signal excursions are of a less regular nature, the high Q resonant circuit may not receive enough energy from the bit stream to maintain sufficient oscillatory signal amplitude to continuously operate the squaring amplifier. In this case, a more expensive phase lock loop (PLL) clock source is usually employed. An all digital circuitry PLL uses a frequency signal of very much higher frequency than that of a required clock signal to generate the clock signal. Variable divide ratio logic circuitry is adjusted in phase by increments as small as but no smaller than half the period of the higher frequency signal to provide the clock signal with controlled phase. Alternately a more analog phase lock loop circuit usually includes a phase comparator for generating an error signal representative of phase error between an output of the PLL clock source and signal excursions in the bit stream. An oscillator, usually an amplifier with a tank circuit connected across the amplifier, is used as a source of the required clock pulses. The frequency of oscillation is made to be variable by including a variable capacitance diode, usually referred to as a varactor diode, in the oscillator so that the frequency of oscillation is varied in response to the error signal.

One solution to reducing the cost of the PLL clock source has been to integrate it in silicon technology with other elements of a typical digital signal receiver. One of the most economical present day integrated circuit technologies for implementing an integrated digital signal receiver is known as complementary metal oxide silicon technology, or CMOS. Unfortunately the all digital circuitry PLL requires circuit functional speed which is not conveniently available in integrated CMOS technology. In the case of the more analog PLL the high frequency problem is avoided but it is difficult to a point of being cost prohibitive to include a variable capacitance diode in a typical CMOS integrated circuit structure.

The invention provides an oscillator circuit and method which is useful as a clock source. The oscillator circuit is particularly suited for inclusion in an integrated circuit structure. Controlled variability of frequency of oscillation is achieved by providing a capacitive reactance and a field effect transistor switch for connecting the capacitive reactance to the oscillator. The field effect transistor is controlled from time to time to connect the capacitive reactance to change the frequency of oscillation of the oscillator such that an average frequency of oscillation is that required for operating the digital receiver.

The invention also includes the oscillator circuit in phase lock loop configurations, and includes a phase lock loop circuit having long term stability and being operable to converge rapidly toward a desired operating frequency.

In accordance with the invention a variable oscillator circuit for supplying clock signals to a receiver of synchronous data signals from a data source includes an amplifier having an input and an output for generating an oscillatory clock signal. A pair of terminals is provided for connecting a tank circuit between the input and the output. First and second capacitors are each connected in series with an electronic switch between a respective one of the terminals and ground. A strobe generator is used to generate strobe signal in response to reception of the data signals by the receiver. A binary phase indication is generated by a phase detector in response to each strobe signal from the strobe generator and a coincident state of the signal at the output of the amplifier. A controller is responsive to a predetermined phase occurrence in the oscillatory signal and the binary phase indication to switch the electronic switch at moments which are phase consistent such that the potentials of each capacitor and the respective terminal of said pair of terminals at the moment of switching are about equal.

Also in accordance with the invention a method for providing clock signals for use in a receiver includes the steps of:

(a) causing an oscillator to be operative at either of two frequencies which are respectively lower and higher than an integer multiple of a frequency of a received signal;

(b) generating a phase error signal in response to a phase comparison between the received signal and the operating frequency of the oscillator; and (c) switching the oscillator back and forth between to two frequencies whereby an average value of the phase error signal corresponds to a preferred predetermined value of the phase error signal.

An example embodiment is discussed with reference to the accompanying drawings in which.

Figure 1:
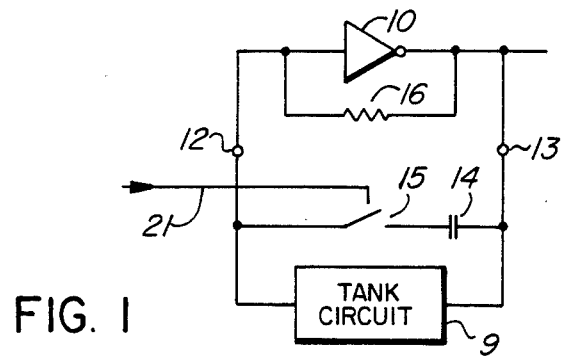
FIG. 1 is a schematic diagram of a variable oscillator in accordance with the invention.

Referring to FIG. 1, an inverting amplifier 10 is connected across a tank circuit 9 via terminals 12 and 13 for oscillatory operation. A capacitor 14 is connected in series with a switch 15 which is controllable to be open or closed such that two frequencies of oscillation, higher and lower, are available.

Figure 2:
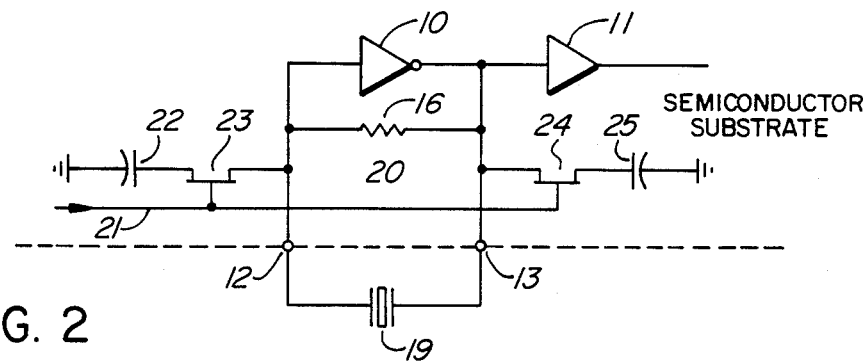
FIG. 2 is a schematic diagram of a variable oscillator similar to FIG. 1 and particularly adapted to being convenient for fabrication in an integrated circuit form.

Referring to FIG. 2, elements of the same function as those in FIG. 1 are labelled with a corresponding number. All of the elements, other than the tank circuit provided by a crystal 19, reside in a semiconductor material substrate. Terminals 12 and 13 provide for connection of a crystal 19 which provides the function of the tank circuit 9 in FIG. 1. The output of the amplifier 10 is shielded from possible loading effects of on-following circuitry, not shown, by a buffer amplifier 11. A capacitive reactance element 22 is coupled between ground and the input of the amplifier via a FET switch 23. Similarly a capacitive reactance element 25 is coupled between ground and the output of the amplifier 10 via a FET switch 24. The capacitive reactance elements 22 and 25 are each conveniently provided by respective areas of conductors carried on a dielectric layer having been formed over another conductive layer in the substrate.

In operation the FETs 23 and 24 are controlled to be conductive or non-conductive via a control path 21. When the FETs are conductive, the frequency of the oscillator is lower than when the FETs are non-conductive. Hence the average frequency of the oscillator is controllable to be between the lower and higher frequencies by switching between the two frequencies as required.

Figure 3:
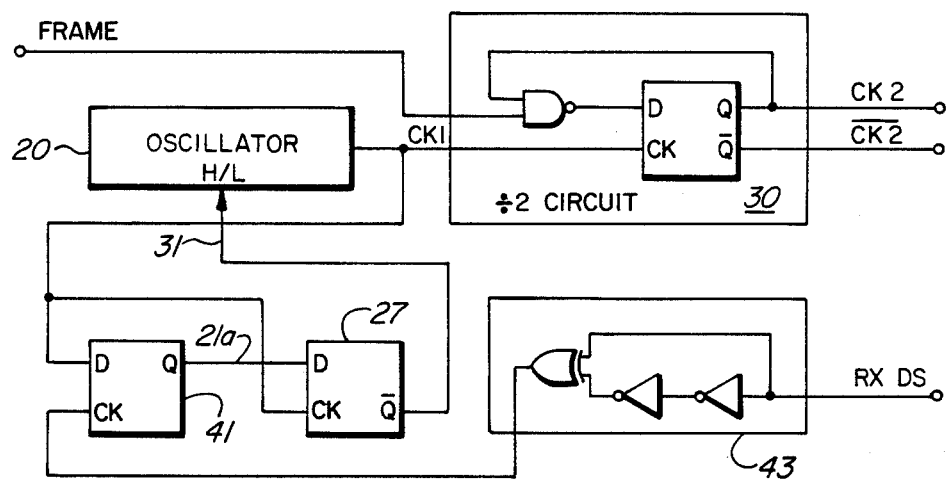
FIG. 3 is a block schematic diagram of a phase lock loop circuit which uses the variable oscillator of FIG. 2 to provide clock signals for a diphase signal digital receiver.

Referring to FIG. 3, elements of the same function as those in FIG. 2 are labelled with a corresponding number. The oscillator 20 is operated at the higher and lower frequencies in accordance with the binary signal state of its high low control input H/L. The output of the oscillator 20 is connected to a divide-by-two circuit as exemplified in circuit block 30. The output of the oscillator circuit 20 provides a first clock signal CK1 which is divided by two to generate clock signals in two phases CK2 and CK2 inverted for use in associated circuitry of a digital signal receiver, not shown. A frame lead provides for control of generation and half period phase of the clock signals CK2 and CK2 inverted. The circuitry in FIG. 3 is particularly suited for providing clock signals for a receiver of binary data as may be encoded for transmission in a diphase signal stream. The diphase signal stream is received from an output of an associated diphase signal receiver (not shown) on a receive diphase signal lead labelled RXDS. A strobe generator exemplified by circuitry in a circuit block 43 responds to each transition in the diphase singal stream by asserting a narrow positive going strobe at a clock input CK of a D type flip flop 41. This causes the instantaneous state of the first clock signal CK1 to be clocked into the flip flop 41. If the state of CK1 is high, its phase is early, and if its state is low, its phase is late. If the phase of CK1 is early, the Q output of the flip flop 41 is clocked high. If the phase of the clock signal CK1 is late, the Q output is clocked low. The state of the Q output of the flip flop 41 appears on a lead 21a and can be used directly to control the frequency of the oscillator 20 to be correspondingly of the lower or higher frequencies. However this can cause undesirable phase shifts or glitches in the output of the oscillator 20. When the FETs 23 and 24 are switched on at a time without reference to the clock signal CK1, it is very likely that the voltages stored in the capacitors 22 and 25 are different than the instant voltages at the terminals 12 and 13. Operation of the oscillator 20 is improved by phase synchronizing signal transitions at its H/L input. A D type flip flop 27, connected as shown, is used to retime changes in the control signal on the lead 21a so that transitions occur on the lead 21 at consistently similar moments of phase angle with respect to the oscillatory signal CK1.

Figure 4:
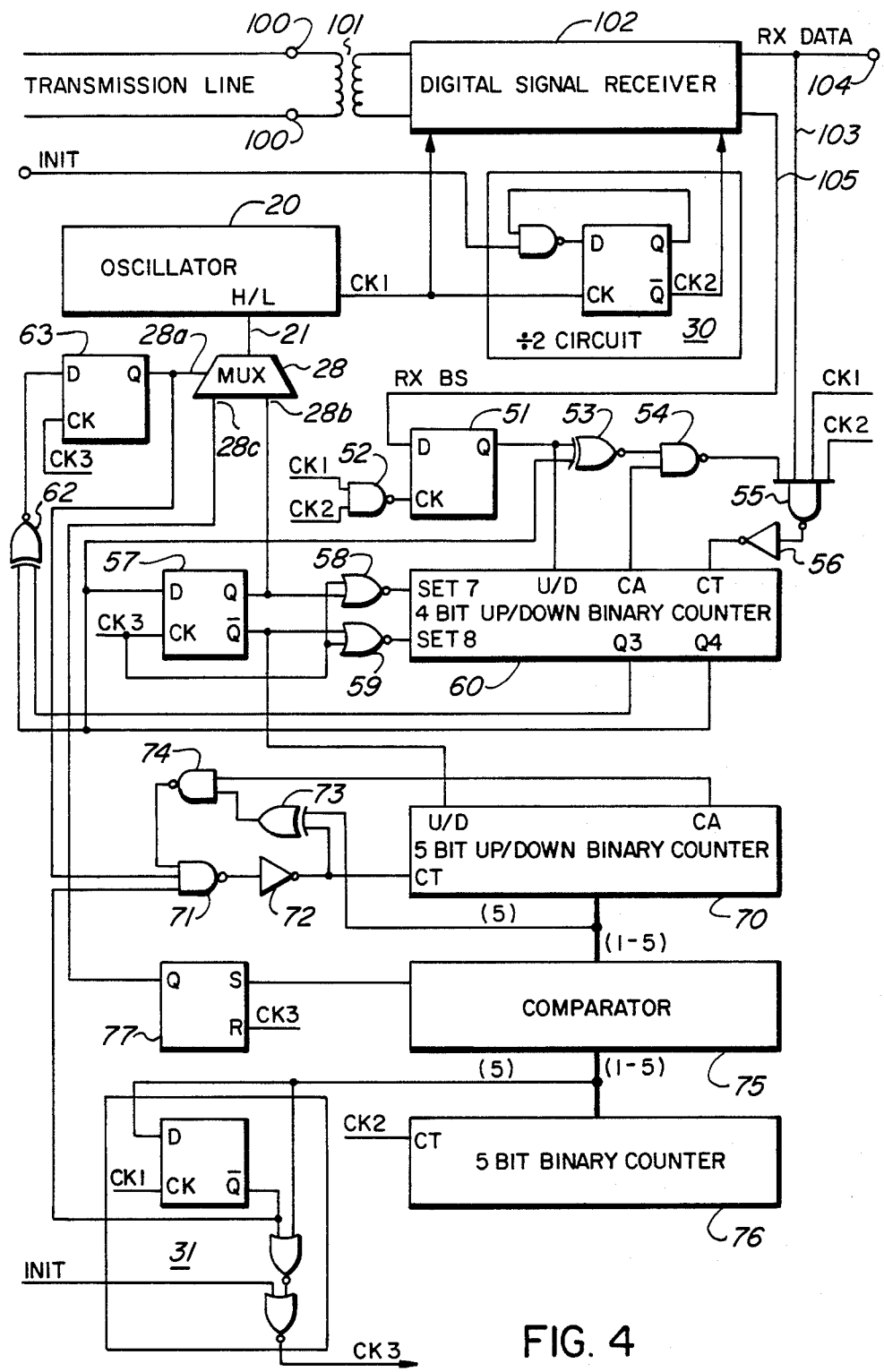
FIG. 4 is a block schematic diagram of a phase lock loop circuit which uses the variable oscillator of FIG. 2 to provide clock signals for a bipolar digital signal receiver.

In FIG. 4 elements having similar functions are those in the preceding figures are labelled with corresponding numbers. Referring to FIG. 4, a digital signal receiver 102 is coupled to transmission line terminals 100 via a transformer 101, for receiving for example a bipolar return to zero (BPRZ) signal stream. A BPRZ signal stream is characterized in that binary information bits of one state are represented by signal excursions of alternate polarity while binary information bits of the other state are represented by an absence of signal excursion. Thus in comparison to the diphase signal previously discussed, there can be periods of time when the BPRZ signal stream has significantly less timing information as compared to a diphase signal stream of a similar information bit content. The digital signal receiver 102 operates in response to clock signals CK1 and CK2 from the oscillator circuit 20 and from the divide-by-two circuit 30 to generate a binary data bit stream on a receive data lead 103 labelled RX DATA, the binary data bit stream corresponding to an information content of the received BPRZ signal stream. The digital receiver 102 also operates to provide a raw bit stream on a lead 105 labelled RBS. The raw bit stream is an intermediate by-product of generating the binary data bit stream and is valuable for timing information as will be described.

The H/L control input of the oscillator 20 in FIG. 4 is connected via the lead 21 to an output of a multiplexer 28. The multiplexer 28 includes an address input 28a, the signal state of which determines which of signals at inputs 28b and 28c are used to select the instant frequency of the oscillator 20. A fast control signal at the input 28b is used to control the oscillator to rapidly attain a preferred phase, and originates with circuitry including a first group of circuit elements labelled 52 through 60. A slower control signal at control input 28c is used to cause the oscillator 20 to substantially maintain a preferred phase relationship once such phase relationship has been achieved. The slower control signal originates with a second group of circuit elements labelled 70 through 77.

In the first group of circuit elements, a 4-bit up/down binary counter 60 counts positive going portions of the received data bit stream in response to signals applied at its count input CI. A D type flip flop 51, NAND gates 52, 54 and 55, an EXCLUSIVE NOR gate 53 and an inverter 56 are connected as shown to control the direction and counting functions of the 4-bit up/down binary counter 60. Raw bit stream signal states on the lead 105 are clocked into the flip flop 51 in response to a logical NANDing of the clock signals CK1 and CK2. A Q output of the flip flop 51 is used to control count direction of the counter 60 via its up/down input U/D. The output of the flip flop 51 is EXCLUSIVE NORed with a most significant output Q4 of the counter 60 by the gate 53. In the event the counter 60 is at an extreme end of its count range, as would be indicated by an assertion of its carry output CA, and the most significant bit and the count directions are of the same state, a stop count is asserted by the NAND gate 54. This prevents any further assertions of the received data bit stream at the count input CT. Thus the counter 60 is prevented from counting past either end of a predetermined range and only begins to count again when the state of the Q output of the flip flop 51 changes, that is when it becomes opposite to the state of the counter 60 output Q4.

The state of the Q4 output of the counter 60 is periodically clocked into a D type flip flop 57 by an asymmetrical clock signal CK3 which occurs at 1/64 of the rate of the clock signal CK2. The clock signal CK3 is generated by circuitry as exemplified in circuit block 31. A Q output of the flip flop 57 is connected to the input 28b to supply the fast control signal. The Q output and a Q inverted output of the flip flop 57 are NORed with the clock signl CK3 at NOR gates 58 and 59 respectively. SET 7 and SET 8 inputs of the counter 60 are each responsive to a positive going edge from the output of the respective NOR gate to accordingly set the counter 60 at a count of seven or eight.

A multiplexer 28 is addressed via a D type flip flop 63 which is periodically updated in response to the clock CK3 with an EXCLUSIVE NORing of the states of the outputs Q3 and Q4 of the binary counter 60. Thus when the states of these outputs are the same, the multiplexer 28 causes the selection of the higher and lower oscillator frequencies to be determined by the state of the flop flop 57. Otherwise the selection is determined by the state of a set reset flip flop 77 in the second group of circuit elements 70 through 77.

The second group of circuit element includes a 5-bit binary up/down counter 70. Logic circuitry 71-74, connected as shown, is responsive to the states of the most significant output (5) and the carry output CA of the counter 70, and the state of the flip flop 63 to gate clock pulses, of the CK3 clock rate, from the circuit block 31. The up/down counter 70 responds to the gated clock pulses as they are asserted at its count input CT to either count up or count down, depending upon the state of the flip flop 57. Thus at every 64th occurrence of a CK2 clock pulse the counter 70 is incremented either up or down in accordance with the instant state of the Q4 output of the counter 60. A 5-bit binary counter 76 is connected to count solely in response to the clock signal CK2 to provide a time reference. The outputs of the counters 76 and 70 are compared to each other in a comparator 75. The flip flop 77 is periodically reset by the clock signaal CK3 and thereafter set in response to each match occurrence between the outputs of the counters 70 and 76. Thus when the oscillator 20 is being controlled by the slower control signal, in a series of 128 pulses of the clock signal CK1 some pulses are generated by the oscillator 20 at the high frequency and the remainder are generated at the lower frequency.

This is in contrast to the alternate case wherein the phase angle of the oscillator output is consistently advanced or retarded throughout each block of 128 pulses of CK1 when the oscillator 20 is under the direct control of the first group of circuit elements 51 through 60.

The result of operation of the circuit in FIG. 4 during more or less regular transitions in the BPRZ bit stream is to provide a very closely phase controlled clock signal being predominantly dictated by the slower control signal. During prolonged absence of transitions in the BPRZ bit stream, control continues to be dictated by the slow control signal. However the ratio of the higher and lower frequency control portion of the control signal are incremented either up or down in accordance with the state of the Q4 output of the counter 60. As the counter 60 remains static in the absence of transition in the BPRZ signal, this will eventually cause the slow control signal to be non-saturated. However when transition again begins to occur with some frequent regularity in the BPRZ signal, consistent phase error is detected by the flip flop 51 which in turn causes the fast control signal to dictate the operation of the oscillator 20 which causes a rapid correction of the phase of the clock signal toward the preferred phase.

What is claimed is:

1. A clock circuit for supplying timing signals or operation of an integrated receiver circuit for receiving synchronous data, the clock circuit comprising:
   an integrated circuit including:
   an amplifier with terminal means for connecting a tank circuit between an input and an output of the amplifier;
   a passive reactance element;
   switch means being operable for connecting and for disconnecting the reactance element across the amplifier whereby in combination with the tank circuit an oscillator circuit is provided and is operable at either of first and second frequencies;
   a phase detector being responsive to the transitions for indicating a corresponding phase relationship of an oscillatory signal from the oscillator circuit; and
   means for generating a control signal for operating the switch means in response to indications from the phase detector whereby substantially synchronous operation is achieved.

2. A clock circuit as defined in claim 1 wherein the control signal generating means includes:
   a register being responsive to a predetermined characteristic of the oscillatory signal for registering said indication of phase relationship from the phase detector whereby changes of state of the control signal are phase synchronized with said predetermined characteristic of the oscillatory signal.

3. A clock circuit for synchronous operation in relation to transitions in a received signal, comprising:
   an amplifier with terminal means for connecting a tank circuit between an input and an output of the amplifier;
   a passive reactance element;
   switch means being operable for connecting and for disconnecting the reactance element across the amplifier whereby in combination with the tank circuit an oscillator circuit is provided and is operable at either of first and second frequencies;
   a phase detector being responsive to the transitions for indicating a corresponding phase relationship of an oscillatory signal from the oscillator circuit; and
   means for generating a control signal for operating the switch means in response to indications from the phase detector, the means for generating the control signal comprising:
   means for generating a time signal in response to the oscillatory signal, the time signal having a period being an integer multiple of the period of the oscillatory signal;
   means for generating a fast control signal, being of a consistent state through the period of the time signal, in response to the indication from the phase detector also being of a consistent state;
   means for generating the slow control signal being of alternate states through the period of time signal wherein a duration of each of the states is determined in response to a ratio of the duration of corresponding states of the fast control signal through a preceding plurality of time signal periods; and
   a selection circuit for coupling the fast control signal to the switch means in response to an indication that the indication from the phase detector has been substantially constant in the preceding period of the time signal and for otherwise coupling the slow control signal to the switch means.

4. A clock circuit as defined in claim 3 wherein the means for generating the time signal comprises a plural stage binary counter and logic means being responsive to a signal from at least one of the stages for generating a pulse signal indicating an end of one period and a beginning of another period of the timing signal.

5. A clock circuit as defined in claim 3 wherein the means for generating the fast control signal comprises:
   a first plural stage binary counter being under the control of the state of the indication from the phase detector for counting up or down in response to a predetermined characteristic of the received signal;
   gating means being responsive to the state of the counter for inhibiting counting beyond a predetermined range;
   means for periodically registering the state of the most significant stage of the binary counter to provide the fast control signal in response to the time signal; and
   setting means for setting the binary counter to a count intermediate the limits of the range in response to the time signal.

6. A clock circuit as defined in claim 5 wherein the slow control signal generating means comprises:
   a second plural stage binary counter being controlled by the state of the most significant stage of the first counter to count up or down in response to the timing signal;
   gating circuitry being operative to pass the timing signal to the second counter in the event that the state of the first counter at the end of the previous period of the time signal was substantially intermediate the limits of the range; and
   logic means for generating the slow control signal having one state coincident with at least a beginning of each period of the time signal and changing to the other state during said period at a moment being defined by the state of the second counter.

7. A method of controlling an oscillator being operable at predetermined lower and higher frequencies for generating a clock signal of a preferred average frequency for use in a receiver of a digital signal bit stream, the method comprising the steps of:
   (i) controlling up and down directions of counting of occurrences of a predetermined characteristic in the bit stream in response to the phase of the clock being late or early with respect to transitions in the bit stream and terminating said counting when a count value reaches a predetermined range limit;
   (ii) defining a periodic timing interval having a period being an integer multiple of the period of the clock signal;
   (iii) providing a fast control signal corresponding to a most significant bit of the count at moments being defined by the timing interval and thereafter setting the value of the count to a value intermediate of the limits of the range;
   (iv) gating the fast control signal to the oscillator in response to a count corresponding to one of the range limits at moments being defined by the timing interval;
   (v) controlling up and down directions of counting of timing interval occurrences in response to corresponding fast control signal states when the fast control signal is being gated to the oscillator;
   (vi) generating a slow control signal having first and second signal states during each time interval, with a moment of transition between the two states being defined by a count value at an end of each timing interval occurrence; and
   (vii) gating the slow control signal to the oscillator in response to a count of step i) being intermediate the range limit at moments defined by the timing interval.

8. A variable oscillator circuit for supplying clock signals to a receiver circuit including an input terminal for receiving synchronous data signals from a data source, the variable oscillator circuit including an amplifier having an input and an output being connected to terminals for connection of a tank circuit thereto, switch means for selectively coupling a capacitive reactance across said terminals for reducing a frequency of oscillation of the variable oscillator circuit, the variable oscillator circuit being characterized in that:
   the amplifier, the switch means and an element for providing the capacitive reactance are all provided in a metal oxide semiconductor (MOS) integrated circuit along with the receiver circuit and a logic circuit, the logic circuit being connected to control the switch means to couple and decouple the capacitive reactance element in response to signal states of the data signal and signal states of an oscillatory signal at the output of the amplifier.

9. A variable oscillator as defined in claim 8 wherein the capacitive reactance element is provided by at least two integrated capacitors and the switch means includes field effect transistor switches being connected in series with each of the terminals and a corresponding one of the integrated capacitors.

10. A variable oscillator as defined in claim 9 wherein the integrated capacitors each comprise, an area of conductive material being carried by a layer of dielectric material, the layers of dielectric material residing on a common conductive layer in the integrated circuit.

11. A variable oscillator circuit for supplying clock signals to a receiver of synchronous data signals from a data source, comprising:
   an amplifier having an input and an output, for generating an oscillatory clock signal;
   a pair of terminals for connecting a tank circuit means between the input and the output;
   first and second capacitors each being connected in series with an electronic switch means between a respective one of the terminals and ground;
   a strobe generator for generating strobe signals in response to reception of the data signals by the receiver;
   a phase detector for generating a binary phase indication in response to each occurrence of a strobe signal and a coincident state of the signal at the output of the amplifier; and
   controlling means for controlling the electronic switch means to couple or decouple the capacitors in accordance with the binary phase indication and at a moment being defined by a predetermined phase occurrence in the oscillatory signal, whereby switching of the capacitors is phase consistent such that the potentials of each capacitor and the respective terminal of said pair of terminals at the moment of switching are about equal.

12. A variable oscillator circuit as defined in claim 11 wherein the controlling means includes a flip-flop being connected such that the phase indication from the phase detector is clocked into the flip-flop with each cycle of the oscillatory signal, the flip-flop including an output being connected to control electrodes of the switch means.

* * * * *